United States Patent
Chen et al.

(10) Patent No.: US 9,620,532 B2
(45) Date of Patent: Apr. 11, 2017

(54) MANUFACTURING METHOD OF TRANSISTOR WITH FLOATING GATE AND APPLICATION METHOD OF TRANSISTOR WITH FLOATING GATE ELECTRODE

(71) Applicant: BOE TECHNOLOGY GROUP CO., LTD., Beijing (CN)

(72) Inventors: Ning Chen, Beijing (CN); Wei Guo, Beijing (CN); Lu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 309 days.

(21) Appl. No.: 14/368,145

(22) PCT Filed: May 8, 2013

(86) PCT No.: PCT/CN2013/075310
§ 371 (c)(1),
(2) Date: Jun. 23, 2014

(87) PCT Pub. No.: WO2014/153810
PCT Pub. Date: Oct. 2, 2014

(65) Prior Publication Data
US 2016/0111454 A1    Apr. 21, 2016

(30) Foreign Application Priority Data

Mar. 29, 2013  (CN) .......................... 2013 1 0108151

(51) Int. Cl.
*H01L 29/08* (2006.01)
*H01L 29/04* (2006.01)
(Continued)

(52) U.S. Cl.
CPC ...... *H01L 27/1251* (2013.01); *G02F 1/13306* (2013.01); *G09G 3/2092* (2013.01);
(Continued)

(58) Field of Classification Search
CPC ........... H01L 27/1251; H01L 29/66825; H01L 29/4908; H01L 21/0228; H01L 29/04; H01L 29/49; H01L 29/16
See application file for complete search history.

(56) References Cited

U.S. PATENT DOCUMENTS 5,151,760 A * 9/1992 Gill ................... H01L 21/28273
257/316
5,733,793 A * 3/1998 Song ................... H01L 21/2022
257/E21.133

(Continued)

FOREIGN PATENT DOCUMENTS

CN    1221124 A    6/1999
CN    1797605 A    7/2006
(Continued)

OTHER PUBLICATIONS

English translation of the International Preliminary Report on Patentability and Written Opinion of the International Searching Authority of PCT/CN2013/075310, issued Sep. 29, 2015.

(Continued)

*Primary Examiner* — Thomas L Dickey
*Assistant Examiner* — Damon Hillman
(74) *Attorney, Agent, or Firm* — Collard & Roe, P.C.

(57) ABSTRACT

Embodiments of the disclosure disclose a transistor with floating gate electrode, a manufacturing method thereof, an application method thereof and a display driving circuit. The transistor with floating gate electrode includes a substrate (1), and a floating gate electrode (3), a source electrode (4), a drain electrode (5) and a control gate electrode (6) disposed on the substrate (1). The transistor with floating gate electrode further comprises a first insulating film (7) and a polysilicon film (8) that are sequentially disposed on the substrate (1), and a channel region (2) is formed in the (Continued)

polysilicon film (8) at a position corresponding to the floating gate electrode (3).

16 Claims, 7 Drawing Sheets (51) Int. Cl.
| | |
|---|---|
| *H01L 29/66* | (2006.01) |
| *H01L 29/78* | (2006.01) |
| *H01L 27/12* | (2006.01) |
| *H01L 21/28* | (2006.01) |
| *H01L 29/788* | (2006.01) |
| *H01L 29/423* | (2006.01) |
| *H01L 29/786* | (2006.01) |
| *G02F 1/133* | (2006.01) |
| *G09G 3/20* | (2006.01) |
| *H01L 21/02* | (2006.01) |
| *H01L 21/265* | (2006.01) |
| *H01L 21/311* | (2006.01) |
| *H01L 21/3213* | (2006.01) |
| *H01L 29/16* | (2006.01) |
| *H01L 29/417* | (2006.01) |
| *H01L 29/49* | (2006.01) |
| *H01L 29/51* | (2006.01) |

(52) U.S. Cl.
CPC .... *H01L 21/0228* (2013.01); *H01L 21/02532* (2013.01); *H01L 21/02595* (2013.01); *H01L 21/02667* (2013.01); *H01L 21/2658* (2013.01); *H01L 21/26513* (2013.01); *H01L 21/28273* (2013.01); *H01L 21/31111* (2013.01); *H01L 21/32133* (2013.01); *H01L 27/1222* (2013.01); *H01L 27/1237* (2013.01); *H01L 27/1262* (2013.01); *H01L 27/1274* (2013.01); *H01L 29/04* (2013.01); *H01L 29/16* (2013.01); *H01L 29/4175* (2013.01); *H01L 29/41733* (2013.01); *H01L 29/42324* (2013.01); *H01L 29/42384* (2013.01); *H01L 29/4908* (2013.01); *H01L 29/513* (2013.01); *H01L 29/518* (2013.01); *H01L 29/66757* (2013.01); *H01L 29/66825* (2013.01); *H01L 29/788* (2013.01); *H01L 29/78675* (2013.01); *G09G 2310/0248* (2013.01); *G09G 2310/08* (2013.01); *G09G 2320/045* (2013.01)

(56) References Cited

U.S. PATENT DOCUMENTS

| | | | |
|---|---|---|---|
| 5,982,462 | A | 11/1999 | Nakano et al. |
| 6,335,716 | B1 | 1/2002 | Yamazaki et al. |
| 6,472,684 | B1 * | 10/2002 | Yamazaki ........... H01L 29/7881 |
| | | | 257/344 |
| 7,968,932 | B2 | 6/2011 | Asami |
| 8,119,479 | B2 | 2/2012 | Da et al. |
| 8,188,535 | B2 | 5/2012 | Asami |
| 8,193,574 | B2 | 6/2012 | Asami |
| 8,629,490 | B2 | 1/2014 | Asami |
| 2005/0250050 | A1 | 11/2005 | Chen et al. |
| 2006/0097250 | A1 * | 5/2006 | Koyama ................ B82Y 10/00 |
| | | | 257/40 |
| 2008/0042128 | A1 | 2/2008 | Furukawa et al. |
| 2010/0148845 | A1 | 6/2010 | Kato |
| 2014/0225116 | A1 * | 8/2014 | Ramkumar ........... H01L 29/792 |
| | | | 257/66 |

FOREIGN PATENT DOCUMENTS

| | | |
|---|---|---|
| CN | 1992351 A | 7/2007 |
| CN | 101047190 A | 10/2007 |
| CN | 1947253 A | 11/2007 |
| CN | 101080815 A | 11/2007 |
| CN | 102017129 A | 4/2011 |
| CN | 102027589 A | 4/2011 |
| CN | 102044545 A | 5/2011 |
| TW | 579604 B | 3/2001 |

OTHER PUBLICATIONS

Chinese Office Action of Chinese Application No. 201310108151.4, mailed Feb. 17, 2015 with English translation.
International Search Report of PCT/CN2013/089596 in English, mailed Jan. 9, 2014.
International Search Report, International Preliminary Report on Patentability and Written Opinion of the International Searching Authority of PCT/CN2013/075310 in Chinese, mailed Jan. 9, 2014.
Second Chinese Office Action of Chinese Application No. 201310108151.4, mailed Jul. 3, 2015 with English translation.
Third Chinese Office Action in Chinese Application No. 201310108151.4, mailed Nov. 24, 2015 with English translation.

* cited by examiner

MANUFACTURING METHOD OF TRANSISTOR WITH FLOATING GATE AND APPLICATION METHOD OF TRANSISTOR WITH FLOATING GATE ELECTRODE

CROSS REFERENCE TO RELATED APPLICATIONS

This application is the National Stage of PCT/CN2013/075310 filed on May 8, 2013, which claims priority under 35 U.S.C. §119 of Chinese Application No. 201310108151.4 filed on Mar. 29, 2013, the disclosure of which is incorporated by reference.

TECHNICAL FIELD

Embodiments of the disclosure relate to a transistor with floating gate electrode based on thin film transistor (TFT) manufacturing process, a manufacturing method of the transistor with floating gate electrode, an application method of the transistor with floating gate electrode, and a display driving circuit.

BACKGROUND

Floating gate electrode technology, though proposed in 1960s, is only applied in the storage field till 1980s due to the restriction caused by manufacturing technology. At present, memories such as EPROM, EEPROM and Flash widely employ the floating gate electrode technology.

Figure 1:
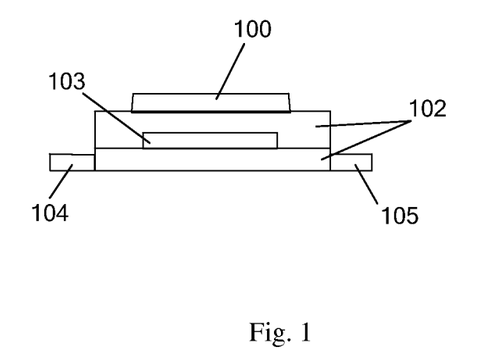
FIG. 1 is a schematic view showing a MOS transistor with floating gate electrode according to one technique.

The term "floating gate electrode" originated from a particular MOS transistor. This transistor has a source electrode 104, a drain electrode 105, and two gate electrode electrodes. One gate electrode has an electrical connection, and is called as a control gate electrode 100 to serve as a normal gate electrode. The other gate electrode has no external lead and is completely wrapped by two $SiO_2$ films 102. Hence, the other gate electrode is floating and is called as a floating gate electrode 103, as shown in FIG. 1.

The operation principle of the MOS transistor with floating gate electrode is that the threshold voltage of the MOS transistor is changed depending on whether and how many charges are stored on the floating gate electrode, so as to change the external characteristics of the MOS transistor. This operation is described as follows. When a high enough voltage (such as 25V) is applied across the drain electrode and the gate electrode of the MOS transistor and the source electrode and the substrate are grounded, the PN junction between the drain electrode and the substrate is reversely broken-down and generates a large amount of high-energy electrons. These electrons pass the very thin $SiO_x$ film and accumulate on the floating gate electrode, so that the floating gate electrode is negatively charged. If the charging process continues for an enough long time, sufficient electrons will accumulate on the floating gate electrode. When the voltage applied across the drain electrode and the gate electrode is not applied any more, the electrons accumulated on the floating gate electrode will exist for a long time since there is no discharge path for these electrons accumulated on the floating gate electrode. When the floating gate electrode is negatively charged, positive charges are induced on the surface of the substrate, which increases the turn-on voltage of the MOS transistor. At this time, if the original threshold voltage that would otherwise turn on the MOS transistor is applied on the gate electrode of the MOS transistor, the MOS transistor will still be in the turn-off state. A memory cell stores binary data by using the above operation principle. The charges on the floating gate electrode generally are adjusted by the following two methods:

(1) Performing long time irradiation on the MOS transistor by ultraviolet light. While being irradiated by ultraviolet light, the electrons on the floating gate electrode form a photocurrent and hence are released.

(2) Applying high voltage between the drain electrode and the gate electrode (the drain electrode is connected with the positive terminal of the power supply, and the gate electrode is connected with the negative terminal of the power supply). This high voltage would generate a strong electric field in the $SiO_x$ film, which pulls the electrons from the floating gate electrode back into the substrate, thereby adjusting the charges on the floating gate electrode.

The floating gate electrode technology introduced above are all based on semiconductor manufacturing process, and has not appeared in the thin film transistor (TFT) manufacturing field.

SUMMARY

According to some embodiments of the disclosure, a transistor with floating gate electrode is provided. The transistor with floating gate electrode comprises a substrate, and a floating gate electrode, a source electrode, a drain electrode and a control gate electrode disposed on the substrate. The transistor with floating gate electrode further comprises a first insulating film and a polysilicon film that are sequentially disposed on the substrate, and a channel region is formed in the polysilicon film at a position corresponding to the floating gate electrode.

For example, a second insulating film and a third insulating film are sequentially disposed on the polysilicon film, and the floating gate electrode is sandwiched between the second insulating film and the third insulating film.

For example, the third insulating film is provided with a first opening and a second opening on both sides of the floating gate electrode; the first opening and the second opening extend to the polysilicon film to form a source electrode via hole and a drain electrode via hole; a metal film is provided in the source electrode via hole to form the source electrode; and a metal film is provided in the drain electrode via hole to form the drain electrode.

For example, a metal film is disposed on the third insulating film at a position corresponding to the floating gate electrode to form the control gate electrode.

For example, the first insulating film, the second insulating film and the third insulating film are formed by SiOx, SiNx, SiOxNy or combinations thereof.

According to some embodiments of the disclosure, a display driving circuit is provided. The display driving circuit comprises the transistor with floating gate electrode as described above.

According to some embodiments of the disclosure, a manufacturing method of a transistor with floating gate electrode is provided. The method comprises steps of: sequentially forming a first insulating film and a polysilicon film on a substrate; forming a channel region in the polysilicon film; forming a second insulating film and a third insulating film on the polysilicon film and forming a floating gate electrode between the second insulating film and the third insulating film; forming a source region and a drain region in the polysilicon film; and forming a source electrode, a drain electrode and a control gate electrode on the third insulating film.

For example, the sequentially forming the first insulating film and the polysilicon film on the substrate comprises:

forming the first insulating film and a first non-crystalline silicon film on the substrate; and carrying out an annealing treatment on the first non-crystalline silicon film to form the polysilicon film.

For example, the forming the channel region in the polysilicon film comprises: coating a first layer of photoresist on a surface of the polysilicon film and exposing, developing the first layer of photoresist, wherein a region of the polysilicon film corresponding to a removed region of the first layer of photoresist is used to form the channel region; implanting borane ions or phosphorane ions into the channel region to so that the polysilicon film at the channel region forms P-type polysilicon or N-type polysilicon; removing the first layer of photoresist by a stripping process; and carrying out an annealing treatment.

For example, the forming the second insulating film and the third insulating film on the polysilicon film and forming the floating gate electrode between the second insulating film and the third insulating film comprises: sequentially depositing the second insulating film and a second non-crystalline silicon film on the polysilicon film by a vapor deposition process; coating a second layer of photoresist on a surface of the second non-crystalline silicon film, exposing and developing the second layer of photoresist so that a reserved portion of the second layer of photoresist correspond to the channel region; reserving a portion of the second non-crystalline silicon film corresponding to the channel region by an etching process to form the floating gate electrode; stripping the second layer of photoresist; and depositing the third insulating film on a surface of the second insulating film and a surface of the floating gate electrode by a vapor deposition process.

For example, the forming the source region and the drain region in the polysilicon film comprises: coating a third layer of photoresist on the third insulating film and exposing and developing the third layer of photoresist; and etching the second insulating film and the third insulating film to remove regions of the second insulating film and the third insulating film corresponding to removed regions of the third layer of photoresist, so that portions of the polysilicon film for forming the source region and the drain region are exposed.

For example, the forming the control gate electrode on the third insulating film comprises: heavily doping borane ions or phosphorane ions into the source region and the drain region to form conducting layers; stripping the third layer of photoresist; depositing a metal film on non-etched regions of the second insulating film and the third insulating film and on the source region and the drain region of the polysilicon film by a vapor deposition process; depositing a fourth layer of photoresist on the metal film and exposing and developing the fourth layer of photoresist; etching the metal film to form the control gate electrode; and stripping the fourth layer of photoresist.

According to some embodiments of the disclosure, an application method of a transistor with floating gate electrode as described above is provided. The comprises the following steps: connecting the control gate electrode and the source electrode with a power supply with preset voltage and grounding the channel region of the polysilicon film and the drain electrode; and cutting off the power supply after a preset time, so that a predetermined amount of negative charges accumulate on the floating gate electrode and a threshold voltage of the transistor with floating gate electrode reaches a preset value.

For example, the method comprises: a voltage of the transistor with floating gate electrode is measured; when the voltage of the transistor with floating gate electrode exceeds a preset regulation voltage, the control gate electrode and the source electrode are grounded, and the channel region and the drain electrode are connected with the power supply with preset voltage; and when the voltage of the transistor with floating gate electrode is smaller than the preset regulation voltage, the control gate electrode and the source electrode are again connected with the power supply with preset voltage and the channel region of the polysilicon film and the drain electrode are again grounded.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

"On," "under," "right," "left" and the like are only used to indicate relative position relationship, and when the position of the object which is described is changed, the relative position relationship may be changed accordingly.

The floating gate electrode technology is broadly applied in EPROM, EEPROM, Flash memories at present. In TFT industry, devices with memory function are equally required, but they have not been manufactured on glass substrates due to the limit of manufacturing process and demands.

Figure 2:
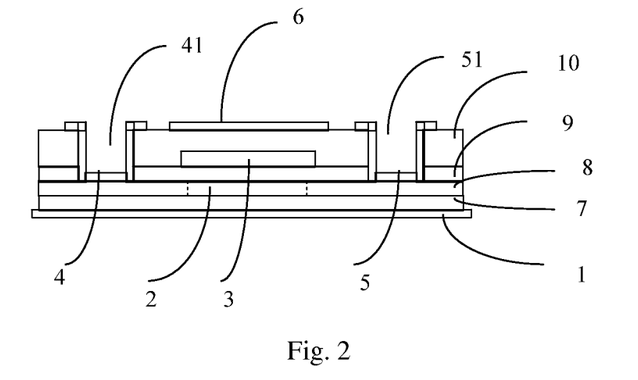
FIG. 2 is a structural view showing a thin film transistor with floating gate electrode according to some embodiments of the disclosure.
Figure 3:
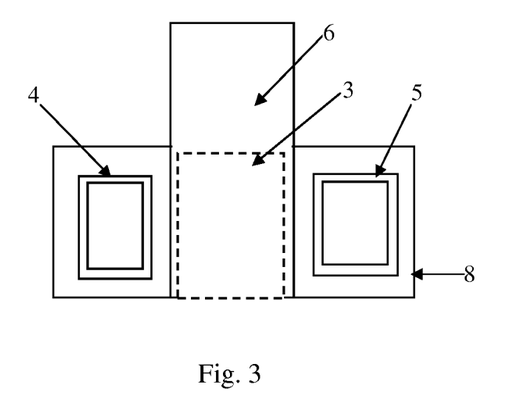
FIG. 3 is a planar view showing the thin film transistor with floating gate electrode according to some embodiments of the disclosure.

As shown in FIGS. 2 and 3, according to some embodiments of the disclosure, a transistor with floating gate electrode is provided. The transistor with floating gate electrode includes a substrate 1, and a floating gate electrode 3, a source electrode 4, a drain electrode 5 and a control gate electrode 6 which are disposed on the substrate 1.

The transistor with floating gate electrode further includes a first insulating film 7 and a polysilicon film 8 that are sequentially disposed on the substrate 1. A channel region 2 is formed in the polysilicon film 8 at a position corresponding to the floating gate electrode 3. That is, the polysilicon film 8 serves as the active layer of the TFT.

A second insulating film 9 and a third insulating film 10 are sequentially disposed on the polysilicon film 8, and the floating gate electrode 3 is sandwiched between the second insulating film 9 and the third insulating film 10.

The third insulating film 10 is provided with a first opening and a second opening on both sides of the floating gate electrode 3 (also on both sides of the channel region of the polysilicon film 8), and the first opening and the second opening extend to the polysilicon film 8 to form a source electrode via hole 41 and a drain electrode via hole 51. A metal film contacting a source region of the polysilicon film 8 is provided in the source electrode via hole 41 to form the source electrode 4. Similarly, a metal film contacting a drain region of the polysilicon film 8 is provided in the drain electrode via hole 51 to form the drain electrode 5.

A metal film is disposed on the third insulating film 10 at a position corresponding to the floating gate electrode 3 to form the control gate electrode 6. The control gate electrode 6 corresponds to the channel region of the polysilicon film 8 through the floating gate electrode 3; and the area of the control gate electrode 6 is greater than or equal to that of the floating gate electrode 3.

For example, a layer of metal film is deposited on the third insulating film 10 and covers exposed portions of the polysilicon film 8. Then, by performing a patterning process, the control gate electrode 6 is formed on the third insulating film 10 and the source electrode 4 and the drain electrode 5 are respectively formed in the exposed portions of the polysilicon film 8.

Depending on practical requirements, the source electrode 4 and the drain electrode 5 are connected to wirings or devices. For example, when the above-mentioned thin film transistor serves as a switching element of a pixel, the source electrode 4 and the drain electrode 5 are connected to a data line and a pixel electrode respectively. For example, these wirings connected to the source electrode 4 and the drain electrode 5 are manufactured together with the source electrode 4 and the drain electrode 5.

For example, the first insulating film, the second insulating film and the third insulating film are manufactured by SiOx, SiNx, SiOxNy or combinations thereof.

In the embodiments of the disclosure, the floating gate electrode technology is applied to the TFT field, the substrate is a glass substrate (or a quartz substrate, a plastic substrate and the like), so that the transistor with floating gate electrode applied in the display driving circuit is able to store charges and threshold voltage of the TFT is able to be adjusted.

The threshold voltage of the transistor with floating gate electrode in the embodiments of the disclosure is able to be adjusted, and thus the problem that the entire circuit does not normally operate for the threshold voltage of the TFT does not meet the preset value for example during the process of manufacturing the backboard of a LCD is solved. In technologies such as low temperature polysilicon, GOA (Gate on Array), COA (Color Filter on Array), one pixel uses several MOS transistors for implementing functions of compensation and driving. By employing the transistor with floating gate electrode according to the embodiments of the invention, the number of MOS transistors is reduced, and the number of pixels and the resolution of the display are increased.

In the GOA technology, gate drivers of the liquid crystal panel are provided on the glass substrate to form the scan driving circuits of the panel. In the COA technology, a color filter layer is provided on an array substrate.

According to some embodiments of the disclosure, a manufacturing method of a transistor with floating gate electrode is provided. The method includes the following steps.

sequentially forming a first insulating film 7 and a polysilicon film 8 on a substrate;

forming a channel region 2 in the polysilicon film 8;

forming a second insulating film 9 and a third insulating film 10 on the polysilicon film 8 and forming a floating gate electrode 3 between the second insulating film 9 and the third insulating film 10;

forming a source region and a drain region in the polysilicon film 8;

forming a source electrode 4, a drain electrode 5 and a control gate electrode 6 on the third insulating film.

One example of sequentially forming the first insulating film 7 and the polysilicon film 8 on the substrate includes: depositing the first insulating film 7 and a first non-crystalline silicon film 81 on the substrate 1; and carrying out an annealing treatment on the first non-crystalline silicon film 81 to form the polysilicon film 8.

After the polysilicon film 8 is formed, if it is required to form an island-like active layer for the TFT, the polysilicon film 8 is patterned to obtain the island-like active layer with a patterning method. For example, the patterning method is photolithographic process.

One example of forming the channel region in the polysilicon film 8 includes: coating a first layer of photoresist 11 on the polysilicon film 8 and exposing, developing the first layer of photoresist 11 to expose the channel region; implanting borane ions or phosphorane ions into the channel region so that the polysilicon film 8 at the channel region forms P-type polysilicon or N-type polysilicon; removing the first layer of photoresist 11 by a stripping process; and carrying out an annealing treatment.

One example of forming the second insulating film 9 and the third insulating film 10 on the polysilicon film 8 and forming the floating gate electrode 3 between the second insulating film 9 and the third insulating film 10 includes: sequentially depositing the second insulating film 9 and a second non-crystalline silicon film 12 on the polysilicon film 8 by a vapor deposition process; coating a second layer of photoresist 13 on a surface of the second non-crystalline silicon film 12, exposing and developing the second layer of photoresist 13 so that a reserved portion of the second layer of photoresist 13 correspond to the channel region; reserving a portion of the second non-crystalline silicon film 12 corresponding to the channel region by an etching process to form the floating gate electrode 3; stripping the second layer of photoresist 13; and depositing the third insulating film 10 on a surface of the second insulating film 9 and a surface of the floating gate electrode 3 by a vapor deposition process. In one example, the floating gate electrode 3 is made of a material other than the non-crystalline silicon film.

One example of forming the source region and the drain region in the polysilicon film 8 includes: coating a third layer of photoresist 14 on the third insulating film 10 and exposing and developing the third layer of photoresist 14; etching the second insulating film 9 and the third insulating film 10 to remove regions of the second insulating film 9 and the third insulating film 10 corresponding to non-reserved areas of the third layer of photoresist 14, so that the first via hole and the second via hole are formed and the source region 82 and the drain region 83 in the polysilicon film 8 are exposed.

One example of forming the control gate electrode 6 on the third insulating film 10 includes: heavily doping borane ions or phosphorane ions into the source region 82 and the drain region 83 so that the source region 82 and the drain region 83 have a good electrical connection with the metal film deposited subsequently; stripping the third layer of photoresist 14; depositing a layer of metal film 15 on non-etched regions of the second insulating film 9 and the third insulating film 10 and on the source region 82 and the drain region 83 of the polysilicon film 8 by a vapor deposition process; depositing a fourth layer of photoresist 16 on the metal film 15 and exposing and developing the fourth layer of photoresist 16; etching the meal film 15 to form the control gate electrode 6; and stripping the fourth layer of photoresist 16. For example, the metal film 15 is made of aluminum, aluminum alloy, copper, copper alloy and the like.

Figure 4:
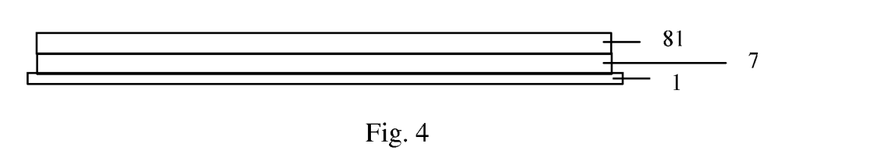
FIGS. 4-21 are structural views showing a first step to a eighteenth step in a manufacturing method of the transistor with floating gate electrode according to some embodiments of the disclosure.
Figure 5:
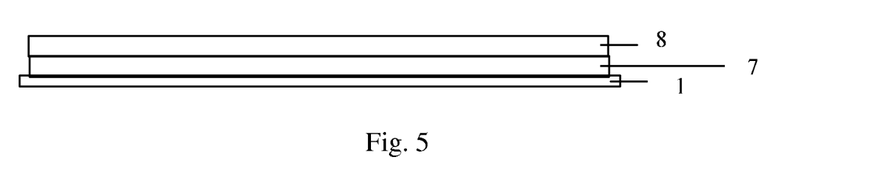
Figure 6:
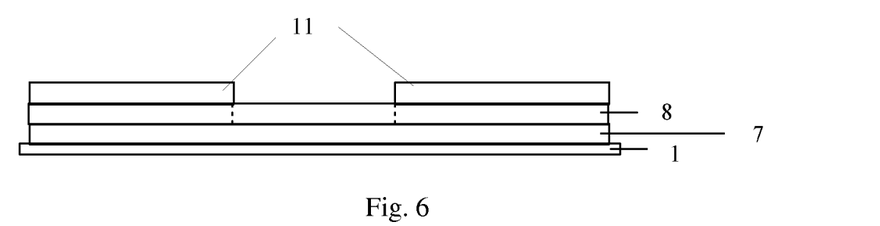

In one example, details of the manufacturing method of the transistor with floating gate electrode is as follows:

Sequentially forming the first insulating film 7 and the first non-crystalline silicon film 81 on the substrate 1 by a PECVD (plasma enhanced vapor deposition) process, as shown in FIG. 4; forming the polysilicon film 8 by performing an ELA (eximer laser annealing) process on the non-crystalline silicon film 81, as shown in FIG. 5; forming the first photoresist layer 11 by a photolithographic process to expose the channel region 2, as shown in FIG. 6. The photolithographic process generally includes coating, exposure and development, which will not be described in detail here.

Figure 7:
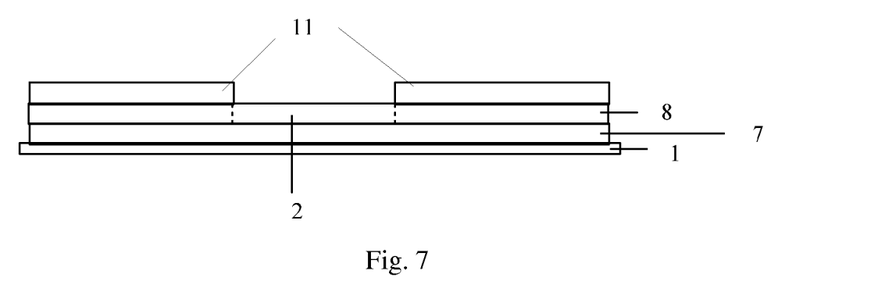
Figure 8:
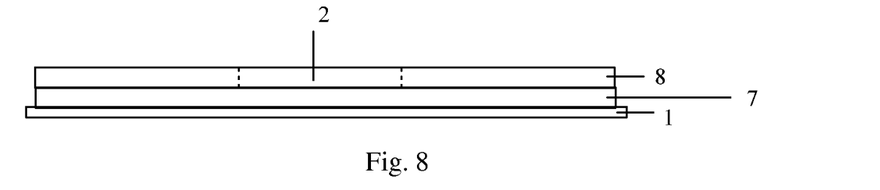
Figure 9:
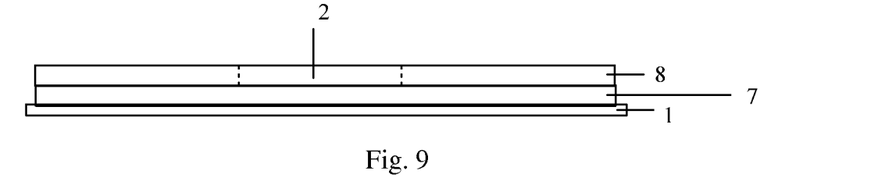
Figure 10:
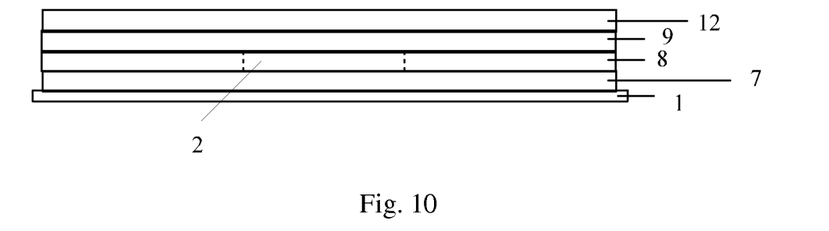
Figure 11:
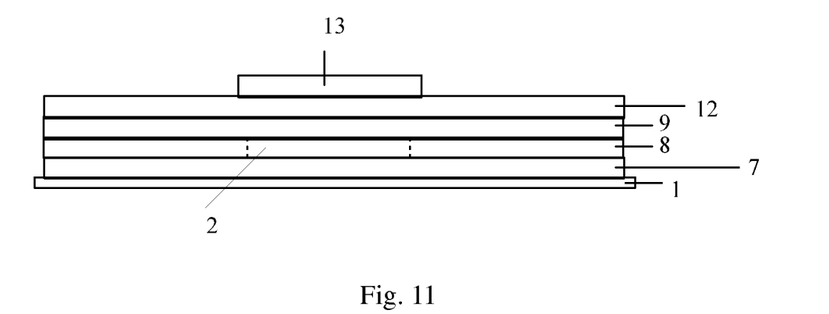
Figure 12:
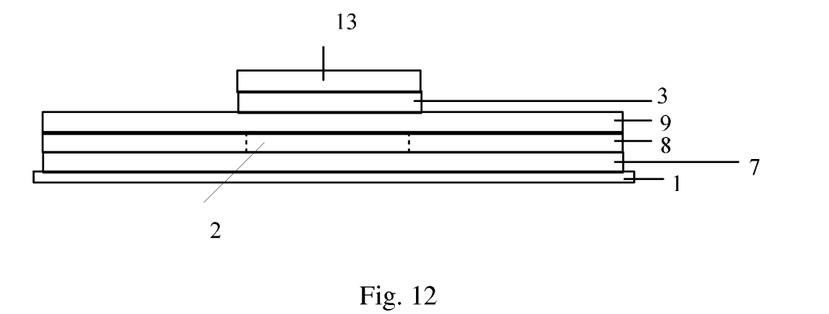
Figure 13:
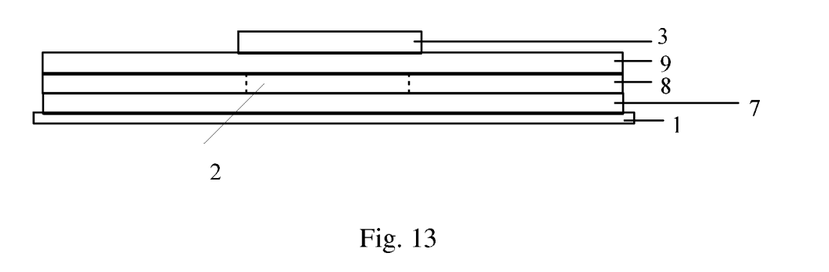
Figure 14:
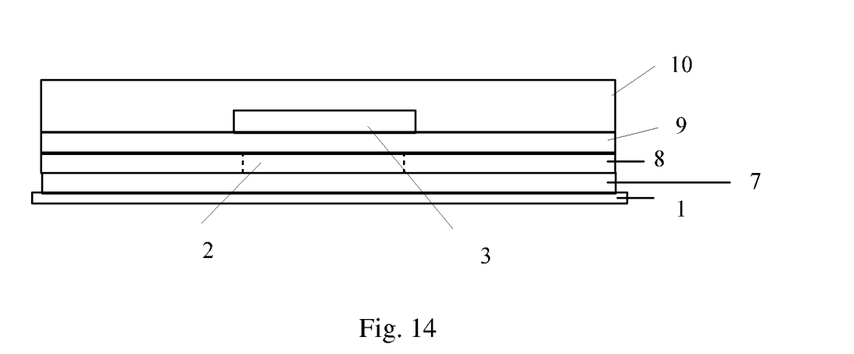
Figure 15:
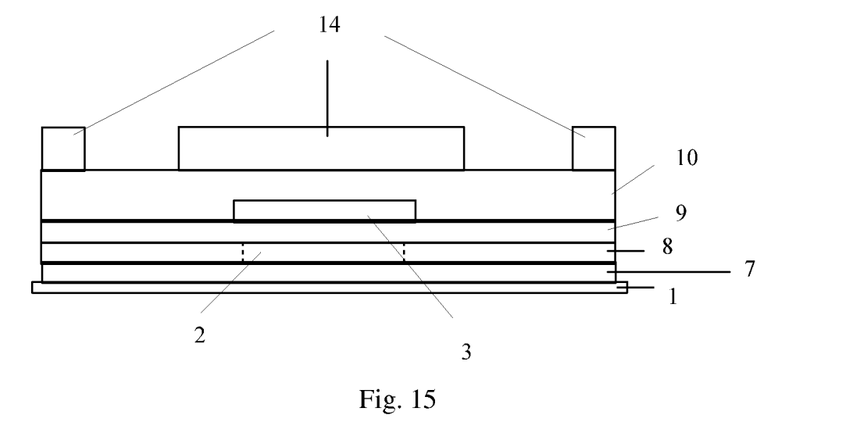
Figure 16:
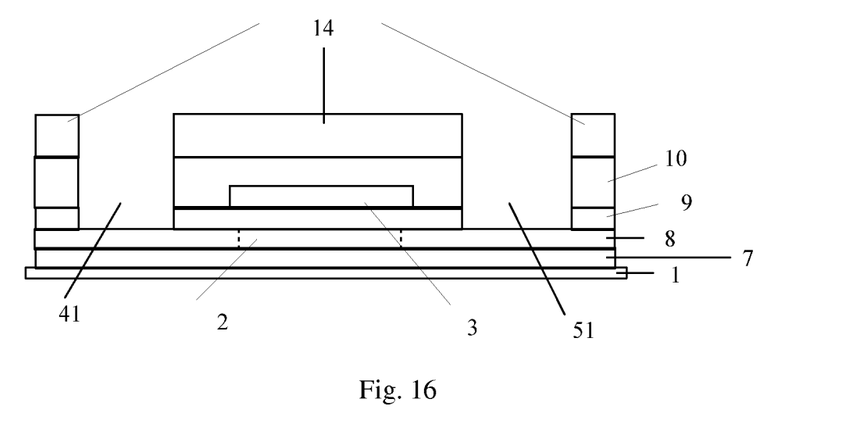
Figure 17:
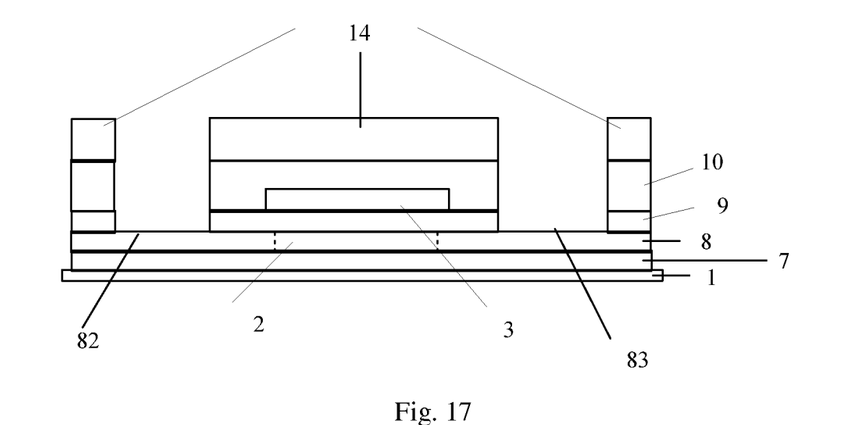
Figure 18:
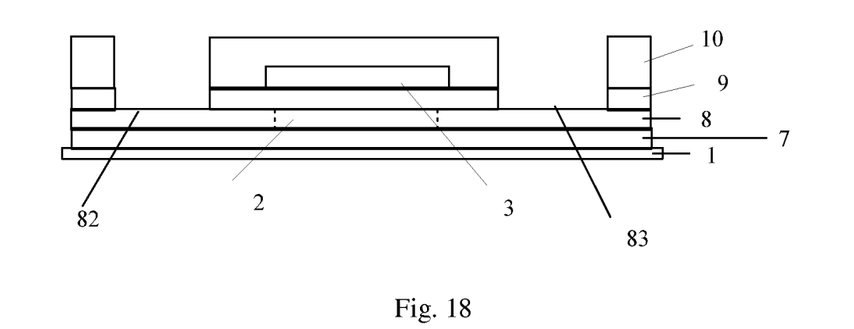
Figure 19:
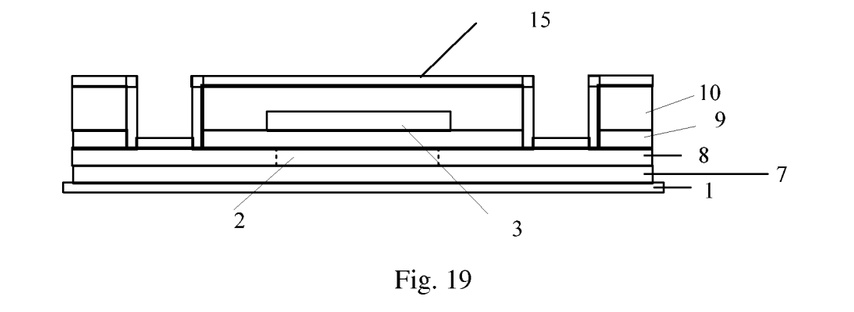
Figure 20:
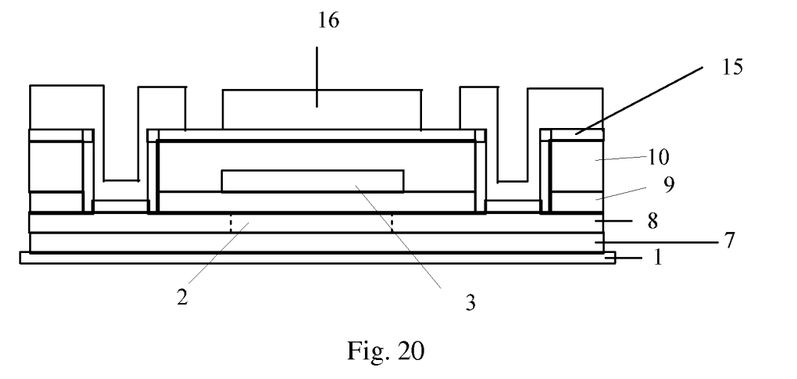
Figure 21:
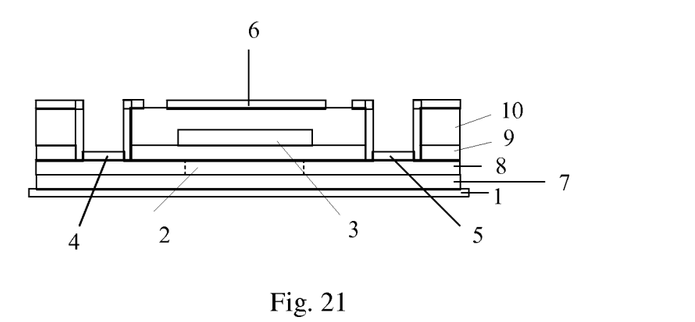

Doping B2H6 (borane) or PH3 (phosphorane) by a doping process to convert the channel region 2 into P+ polysilicon (P type polysilicon) or N+ polysilicon (N type polysilicon), as shown in FIG. 7; stripping off the first layer of photoresist 11 by a stripping process, as shown in FIG. 8; activating the P+ polysilicon or N+ polysilicon by an annealing process, as shown in FIG. 9; sequentially forming the second insulating film 9 and the second non-crystalline silicon film 12 by a PECVD process, as shown in FIG. 10; obtaining the second layer of photoresist 13 by a photolithographic process so as to be provided above the channel region 2, as shown in FIG. 11; etching the second non-crystalline silicon film 12 to form the floating gate electrode 3 by an etching process, as shown in FIG. 12; stripping off the second layer of photoresist 13 by a stripping process, as shown in FIG. 13; forming the third insulating film 10 by a PECVD process to completely cover the floating gate electrode 3, as shown in FIG. 14; obtaining the third layer of photoresist 14 by a photolithographic process to expose regions for forming the source electrode via hole 41 and the drain electrode via hole 51 of the transistor, as shown in FIG. 15; forming the source electrode via hole 41 and the drain electrode via hole 51 by an etching process, as shown in FIG. 16; heavily doping exposed regions of the polysilicon film 8 by a doping process to form the source region 82 and the drain region 83, for example, implanting borane ions or phosphorane ions into regions corresponding to the source electrode via hole 41 and the drain electrode via hole 51, as shown in FIG. 17; stripping off the third layer of photoresist 14 by a stripping process, as shown in FIG. 18; depositing the metal film 15 by a sputtering (spraying) process, as shown in FIG. 19; obtaining the fourth layer of photoresist 16 by a photolithographic process to cover regions for forming the source electrode, the drain electrode and the control gate electrode of the transistor in, as shown in FIG. 20; etching the metal film 15 to form the source electrode 4, the drain electrode 5 and the control gate electrode 6, wherein the source electrode 4 and the drain electrode 5 contact the source region 82 and the drain region 83 respectively; stripping off the fourth layer of photoresist 16 by a stripping process, as shown in FIG. 21.

According to some embodiments of the disclosure, an application method of the transistor with floating gate electrode is provided. The transistor with floating gate electrode is manufactured by the above manufacturing method of the transistor with floating gate electrode. The application method of the transistor with floating gate electrode includes the following steps: connecting the control gate electrode and the source electrode with a power supply with preset voltage and grounding the channel region and the drain electrode; cutting off the power supply after a preset time, so that a predetermined amount of negative charges accumulate on the floating gate electrode and the threshold voltage of the transistor with floating gate electrode reaches a preset value.

The threshold voltage of the transistor is changed depending on whether or how many charges are stored on the floating gate electrode. The floating gate electrode store enough charges after the charging process continues for the preset time.

For example, the preset voltage is 25V. However, the embodiments of the disclosure is not limited thereto, an appropriate preset voltage may be selected according to the manufactured TFT.

The voltage of the transistor with floating gate electrode is measured. When the voltage of the transistor with floating gate electrode exceeds a preset regulation voltage, the control gate electrode and the source electrode are grounded, and the channel region and the drain electrode are connected with the power supply with the preset voltage. When the voltage of the transistor with floating gate electrode is smaller than the preset regulation voltage, the control gate electrode and the source electrode are again connected with the power supply with the preset voltage and the channel region of the polysilicon film and the drain electrode are again grounded.

Alternatively, when the voltage of the transistor with floating gate electrode exceeds the preset regulation voltage, the charges are released by ultraviolet irradiation.

Figure 22:
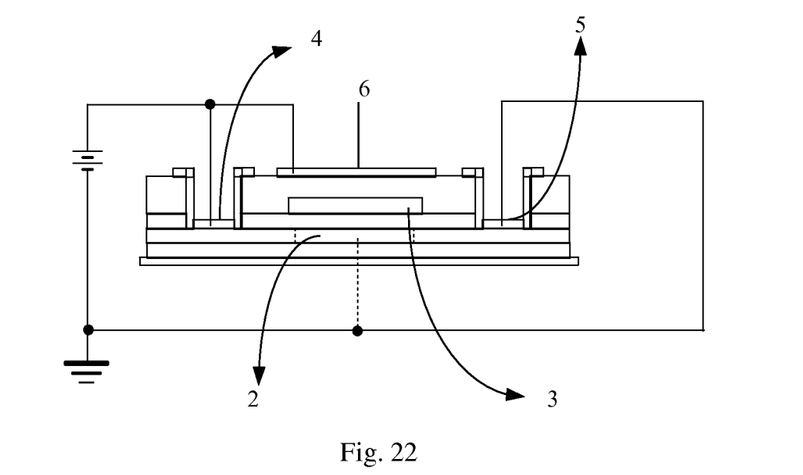
FIG. 22 is a schematic view showing an application method of the transistor with floating gate electrode according to some embodiments of the disclosure.
Figure 23:
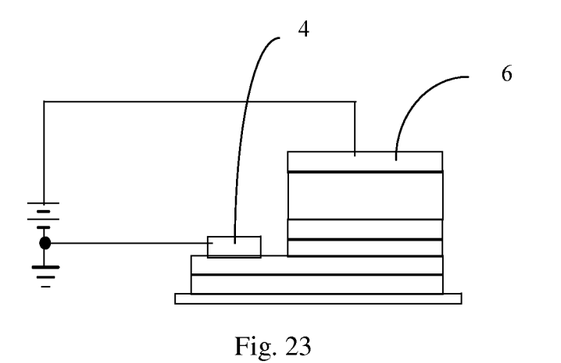
FIG. 23 is a schematic view showing the application method of the transistor with floating gate electrode according to some embodiments of the disclosure.

For example, details of the process of adjusting the threshold voltage of the TFT is as follows: connecting the control gate electrode and the source electrode with a programmable power supply VCC and grounding the channel region and the drain electrode, as shown in FIG. 22; applying a voltage of 25V by the programmable power supply, and controlling the duration of applying the voltage by the programmable power supply according to the amount of charges on the floating gate electrode to be stored, as shown in FIG. 23; after a preset time, the programmable power supply is cutoff.

The threshold voltage of the TFT (voltage required for normally turning on the transistor with floating gate electrode) is measured to determine whether the threshold voltage of the TFT meet conditions for the circuit to normally operate. If not, the above method is performed to adjust the threshold voltage of the TFT.

The floating gate electrode of the transistor is able to store a certain amount of charges, and the control gate electrode normally drives the transistor in the case that the normal driving voltage plus the voltage of the floating gate electrode is applied. The floating gate electrode adjusts the threshold voltage of the TFT by means of this principle. In this way, the case that the entire circuit does not normally operate since the threshold voltage of TFT does not meet the preset value is avoided, and the cost is reduced. Adjustment of the threshold voltage of the TFT by the floating gate electrode is implemented after completing the manufacture process of the TFT. Depending on the measurement result of the threshold voltage of the TFT, the floating gate electrode is charged or discharged for those TFTs with threshold voltages not within the normal range so that those TFTs can operate, which significantly improves the yield of the products.

According to some embodiments of the disclosure, a display driving circuit is provided. The display driving circuit includes a transistor with floating gate electrode as shown in FIG. 2. The transistor with floating gate electrode includes a substrate 1, and a floating gate electrode 3, a source electrode 4, a drain electrode 5 and a control gate electrode 6 which are disposed on the substrate 1. The transistor with floating gate electrode further includes a first insulating film 7 and a polysilicon film 8 that are sequentially disposed on the substrate 1. A channel region 2 is formed in the polysilicon film 8 at a position corresponding to the floating gate electrode 3.

The provision manner of the channel region 2 is in favor of the manufacturing of floating gate electrode during the manufacturing process of the transistor with floating gate electrode. This is because if a bottom gate electrode structure is adopted, the ELA process will damage the metal gate electrode.

A second insulating film 9 and a third insulating film 10 are sequentially disposed on the polysilicon film 8, and the floating gate electrode 3 is sandwiched between the second insulating film 9 and the third insulating film 10.

The third insulating film 10 is provided with a first opening and a second opening on both sides of the floating gate electrode 3, and the first opening and the second opening extend to the polysilicon film 8 to form a source electrode via hole 41 and a drain electrode via hole 51. A metal film contacting a source region of the polysilicon film 8 is provided in the source electrode via hole 41 to form the source electrode 4. Similarly, a metal film contacting a drain region of the polysilicon film 8 is provided in the drain electrode via hole 51 to form the drain electrode 5.

A metal film is disposed on the third insulating film 10 at a position corresponding to the floating gate electrode 3 to form the control gate electrode 6. The control gate electrode 6 corresponds to the channel region 2.

For example, a layer of metal film is deposited on the third insulating film 10 and covers portions of the polysilicon film 8 exposed by the third insulating film 10. Then, by performing a patterning process, the control gate electrode 6 is formed on the third insulating film 10 and the source electrode 4 and the drain electrode 5 are respectively formed in the exposed portions of the polysilicon film 8.

For example, the first insulating film, the second insulating film and the third insulating film are manufactured by SiOx, SiNx, SiOxNy or combinations thereof. FIG. 2 only shows partial structure of the transistor with floating gate electrode.

The transistor with floating gate electrode according to the embodiments of the disclosure is able to be in place of thin film transistors in prior art. The threshold voltage of the transistor with floating gate electrode is adjustable, and thus the case that the entire circuit does not normally operate for the threshold voltage of the TFT does not meet the preset value is avoided.

According to some embodiments of the disclosure, a manufacturing method of a display driving circuit is provided. The method includes the following steps: manufacturing electronic elements of the display driving circuit on a PCB. The electronic elements comprise a transistor with floating gate electrode. The manufacturing process of the transistor with floating gate electrode includes:

sequentially forming a first insulating film 7 and a polysilicon film 8 on a substrate;

forming a channel region 2 in the polysilicon film 8;

forming a second insulating film 9 and a third insulating film 10 on the polysilicon film 8 and forming a floating gate electrode 3 between the second insulating film 9 and the third insulating film 10;

forming a source region and a drain region in the polysilicon film 8;

forming a source electrode 4, a drain electrode 5 and a control gate electrode 6 on the third insulating film.

One example of sequentially forming the first insulating film 7 and the polysilicon film 8 on the substrate includes: depositing the first insulating film 7 and a first non-crystalline silicon film 81 on the substrate 1; and carrying out an annealing treatment on the first non-crystalline silicon film 81 to form the polysilicon film 8.

One example of forming the channel region in the polysilicon film 8 includes: coating a first layer of photoresist 11 on the polysilicon film 8 and exposing, developing the first layer of photoresist 11 to expose the channel region; implanting borane ions or phosphorane ions into the channel region so that the polysilicon film 8 at the channel region forms P-type polysilicon or N-type polysilicon; removing the first layer of photoresist 11 by a stripping process; and carrying out an annealing treatment.

One example of forming the second insulating film 9 and the third insulating film 10 on the polysilicon film 8 and forming the floating gate electrode 3 between the second insulating film 9 and the third insulating film 10 includes: sequentially depositing the second insulating film 9 and a second non-crystalline silicon film 12 on the polysilicon film 8 by a vapor deposition process; coating a second layer of photoresist 13 on a surface of the second non-crystalline silicon film 12, exposing and developing the second layer of photoresist 13 so that a reserved portion of the second layer of photoresist 13 correspond to the channel region; reserving a portion of the second non-crystalline silicon film 12 corresponding to the channel region by an etching process to form the floating gate electrode 3; stripping the second layer of photoresist 13; and depositing the third insulating film 10 on a surface of the second insulating film 9 and a surface of the floating gate electrode 3 by a vapor deposition process. The third insulating film 10 covers the floating gate electrode 3.

One example of forming the source region and the drain region in the polysilicon film 8 includes: coating a third layer of photoresist 14 on the third insulating film 10 and exposing and developing the third layer of photoresist 14 to expose regions where the source region and the drain region are to be formed; etching the second insulating film 9 and the third insulating film 10 to remove regions of the second insulating film 9 and the third insulating film 10 corresponding to non-reserved regions of the third layer of photoresist 14, so that the source region 82 and the drain region 83 in the polysilicon film 8 are formed.

One example of forming the control gate electrode 6 on the third insulating film 10 includes: heavily doping borane ions or phosphorane ions into the source region 82 and the drain region 83 so that the source region 82 and the drain region 83 have a good electrical connection with the metal film deposited subsequently; stripping the third layer of photoresist 14; depositing a layer of metal film 15 on non-etched regions of the second insulating film 9 and the third insulating film 10 and on the source region 82 and the drain region 83 of the polysilicon film 8 by a vapor deposition process; depositing a fourth layer of photoresist 16 on the metal film 15 and exposing and developing the fourth layer of photoresist 16; etching the meal film 15 to form the control gate electrode 6; and stripping the fourth layer of photoresist 16.

According to some embodiments of the disclosure, an application method of a display driving circuit is provided. In practical applications, calibration is performed by adjusting the threshold voltage of the transistor with floating gate electrode in the display driving circuit, so that the display driving circuit normally operates. The adjustment process of the threshold voltage of the transistor with floating gate electrode includes: connecting the control gate electrode and the source electrode with a power supply with preset voltage and grounding the channel region and the drain electrode; cutting off the power supply after a preset time, so that a predetermined amount of negative charges accumulate on the floating gate electrode and the threshold voltage of the transistor with floating gate electrode reaches a preset value.

The threshold voltage of the transistor is changed depending on whether or how many charges are stored on the floating gate electrode. The floating gate electrode store enough charges after the charging process continues for the preset time.

For example, the preset voltage is 25V. However, the embodiments of the disclosure is not limited thereto, an appropriate preset voltage may be selected according to the structure and the materials of the manufactured TFT.

The voltage of the transistor with floating gate electrode is measured. When the voltage of the transistor with floating gate electrode exceeds a preset regulation voltage, the control gate electrode and the source electrode are grounded, and the channel region and the drain electrode are connected with the power supply with the preset voltage. When the voltage of the transistor with floating gate electrode is smaller than the preset regulation voltage, the control gate electrode and the source electrode are again connected with the power supply with the preset voltage and the channel region of the polysilicon film and the drain electrode are again grounded.

Alternatively, when the voltage of the transistor with floating gate electrode exceeds the preset regulation voltage, the charges are released by ultraviolet irradiation.

For example, details of the process of adjusting the threshold voltage of the TFT is as follows: connecting the control gate electrode and the source electrode with a programmable power supply VCC and grounding the channel region and the drain electrode, as shown in FIG. 22; applying a voltage of 25V by the programmable power supply, and controlling the duration of applying the voltage by the programmable power supply according to the amount of charges on the floating gate electrode to be stored, as shown in FIG. 23; after a preset time, the programmable power supply is cutoff.

The threshold voltage of the TFT is measured to determine whether the threshold voltage of the TFT meet conditions for the circuit to normally operate. If not, the above method is performed to adjust the threshold voltage of the TFT.

The floating gate electrode of the transistor is able to store a certain amount of charges, and the control gate electrode normally drives the transistor in the case that the normal driving voltage plus the voltage of the floating gate electrode is applied. The floating gate electrode adjusts the threshold voltage of the TFT by means of this principle. In this way, the case that the entire circuit does not normally operate since the threshold voltage of TFT is not met the preset value is avoided, and the cost is reduced. Adjustment of the threshold voltage of the TFT by the floating gate electrode is implemented after completing the manufacture process of the TFT. Depending on the measurement result of the threshold voltage of the TFT, the floating gate electrode is charged or discharged for those TFTs with threshold voltages not within the normal range so that those TFTs can operate normally, which significantly improves the yield of the products.

The foregoing embodiments merely are exemplary embodiments of the invention, and not intended to define the scope of the invention, and the scope of the invention is determined by the appended claims.

What is claimed is:

1. A manufacturing method of a transistor with floating gate electrode, comprising steps of:
   sequentially forming a first insulating film and a polysilicon film on a substrate;
   forming a channel region in the polysilicon film;
   forming a second insulating film and a third insulating film on the polysilicon film and forming a floating gate electrode between the second insulating film and the third insulating film;
   forming a source region and a drain region in the polysilicon film; and
   forming a source electrode, a drain electrode and a control gate electrode on the third insulating film,
   wherein the forming the second insulating film and the third insulating film on the polysilicon film and forming the floating gate electrode between the second insulating film and the third insulating film comprises:
   sequentially depositing the second insulating film and a second non-crystalline silicon film on the polysilicon film by a vapor deposition process;
   coating a second layer of photoresist on a surface of the second non-crystalline silicon film, exposing and developing the second layer of photoresist so that a reserved portion of the second layer of photoresist correspond to the channel region;
   reserving a portion of the second non-crystalline silicon film corresponding to the channel region by an etching process to form the floating gate electrode;
   stripping the second layer of photoresist; and
   depositing the third insulating film on a surface of the second insulating film and a surface of the floating gate electrode by a vapor deposition process.

2. The manufacturing method of the transistor with floating gate electrode according to claim 1, wherein the sequentially forming the first insulating film and the polysilicon film on the substrate comprises:
  forming the first insulating film and a first non-crystalline silicon film on the substrate; and
  carrying out an annealing treatment on the first non-crystalline silicon film to form the polysilicon film.

3. The manufacturing method of the transistor with floating gate electrode according to claim 1, wherein the forming the channel region in the polysilicon film comprises:
  coating a first layer of photoresist on a surface of the polysilicon film and exposing, developing the first layer of photoresist, wherein a region of the polysilicon film corresponding to a removed region of the first layer of photoresist is used to form the channel region;
  implanting borane ions or phosphorane ions into the channel region to so that the polysilicon film at the channel region forms P-type polysilicon or N-type polysilicon;
removing the first layer of photoresist by a stripping process; and
  carrying out an annealing treatment.

4. The manufacturing method of the transistor with floating gate electrode according to claim 1, wherein the forming the source region and the drain region in the polysilicon film comprises:
  coating a third layer of photoresist on the third insulating film and exposing and developing the third layer of photoresist; and
  etching the second insulating film and the third insulating film to remove regions of the second insulating film and the third insulating film corresponding to removed regions of the third layer of photoresist, so that portions of the polysilicon film for forming the source region and the drain region are exposed.

5. The manufacturing method of the transistor with floating gate electrode according to claim 4, wherein the forming the control gate electrode on the third insulating film comprises:
  heavily doping borane ions or phosphorane ions into the source region and the drain region to form conducting layers;
  stripping the third layer of photoresist;
  depositing a metal film on non-etched regions of the second insulating film and the third insulating film and on the source region and the drain region of the polysilicon film by a vapor deposition process;
  depositing a fourth layer of photoresist on the metal film and exposing and developing the fourth layer of photoresist;
  etching the metal film to form the control gate electrode; and
  stripping the fourth layer of photoresist.

6. The manufacturing method of the transistor with floating gate electrode according to claim 2, wherein the step of forming the channel region in the polysilicon film comprises:
  coating a first layer of photoresist on a surface of the polysilicon film and exposing, developing the first layer of photoresist, wherein a region of the polysilicon film corresponding to a removed region of the first layer of photoresist is used to form the channel region;
  implanting borane ions or phosphorane ions into the channel region to so that the polysilicon film at the channel region forms P-type polysilicon or N-type polysilicon;
  removing the first layer of photoresist by a stripping process; and
  carrying out an annealing treatment.

7. An application method of a transistor with floating gate electrode, the transistor with floating gate electrode comprising a substrate, and a floating gate electrode, a source electrode, a drain electrode and a control gate electrode disposed on the substrate,
  wherein the transistor with floating gate electrode further comprises a polysilicon film disposed on the substrate, and a channel region is formed in the polysilicon film at a position corresponding to the floating gate electrode, and
  wherein the application method comprises the following steps:
  connecting the control gate electrode and the source electrode with power supply with preset voltage and grounding the channel region of the polysilicon film and the drain electrode; and
  cutting off the power supply after a preset time, so that a predetermined amount of negative charges accumulate on the floating gate electrode and a threshold voltage of the transistor with floating gate electrode reaches a preset value.

8. The application method of the transistor with floating gate electrode according to claim 7, wherein the method comprises:
  a voltage of the transistor with floating gate electrode is measured;
  when the voltage of the transistor with floating gate electrode exceeds a preset regulation voltage, the control gate electrode and the source electrode are grounded, and the channel region and the drain electrode are connected with the power supply with preset voltage; and
  when the voltage of the transistor with floating gate electrode is smaller than the preset regulation voltage, the control gate electrode and the source electrode are again connected with the power supply with preset voltage and the channel region of the polysilicon film and the drain electrode are again grounded.

9. A manufacturing method of a transistor with floating gate electrode, comprising steps of:
  sequentially forming a first insulating film and a polysilicon film on a substrate;
  forming a channel region in the polysilicon film;
  forming a second insulating film and a third insulating film on the polysilicon film and forming a floating gate electrode between the second insulating film and the third insulating film;
  forming a source region and a drain region in the polysilicon film; and
  forming a source electrode, a drain electrode and a control gate electrode on the third insulating film
  wherein the forming the source region and the drain region in the polysilicon film comprises:
  coating a third layer of photoresist on the third insulating film and exposing and developing the third layer of photoresist; and
  etching the second insulating film and the third insulating film to remove regions of the second insulating film and the third insulating film corresponding to removed regions of the third layer of photoresist, so that portions of the polysilicon film for forming the source region and the drain region are exposed.

10. The manufacturing method of the transistor with floating gate electrode according to claim 9, wherein the step of sequentially forming the first insulating film and the polysilicon film on the substrate comprises:
forming the first insulating film and a first non-crystalline silicon film on the substrate; and
carrying out an annealing treatment on the first non-crystalline silicon film to form the polysilicon film.

11. The manufacturing method of the transistor with flowing gate electrode according to claim 10, wherein the step of forming the channel region in the polysilicon film comprises:
coating a first layer of photoresist on a surface of the polysilicon film and exposing, developing the first layer of photoresist, wherein a region of the polysilicon film corresponding to a removed region of the first layer of photoresist is used to form the channel region;
implanting borane ions or phosphorane ions into the channel region to so that the polysilicon film at the channel region forms P-type polysilicon or N-type polysilicon;
removing the first layer of photoresist by a stripping process; and
carrying out an annealing treatment.

12. The manufacturing method of the transistor with floating gate electrode according to claim 10, wherein the steps of forming the second insulating film and the third insulating film on the polysilicon film and forming the floating gate electrode between the second insulating film and the third insulating film comprise:
sequentially depositing the second insulating film and a second non-crystalline silicon film on the polysilicon film by a vapor deposition process;
coating a second layer of photoresist on a surface of the second non-crystalline silicon film, exposing and developing the second layer of photoresist so that a reserved portion of the second layer of photoresist correspond to the channel region;
reserving a portion of the second non-crystalline silicon film corresponding to the channel region by an etching process to form the floating gate electrode;
stripping the second layer of photoresist; and
depositing the third insulating film on a surface of the second insulating film and a surface of the floating gate electrode by a vapor deposition process.

13. The manufacturing method of the transistor with floating gate electrode according to claim 9, wherein the step of forming the channel region in the polysilicon film comprises:
coating a first layer of photoresist on a surface of the polysilicon film and exposing, developing the first layer of photoresist, wherein a region of the polysilicon film corresponding to a removed region of the first layer of photoresist is used to form the channel region;
implanting borane ions or phosphorane ions into the channel region to so that the polysilicon film at the channel region forms P-type polysilicon or N-type polysilicon;
removing the first layer of photoresist by a stripping process; and
carrying out an annealing treatment.

14. The manufacturing method of the transistor with floating gate electrode according to claim 13, wherein the steps of forming the second insulating film and the third insulating film on the polysilicon film and forming the floating gate electrode between the second insulating film and the third insulating film comprise:
sequentially depositing the second insulating film and a second non-crystalline silicon film on the polysilicon film by a vapor deposition process;
coating a second layer of photoresist on a surface of the second non-crystalline silicon film, exposing and developing the second layer of photoresist so that a reserved portion of the second layer of photoresist correspond the channel region;
reserving a portion of the second non-crystalline silicon film corresponding to the channel region by an etching process to form the floating gate electrode;
stripping the second layer of photoresist; and
depositing the third insulating film on a surface of the second insulating film and a surface of the floating gate electrode by a vapor deposition process.

15. The manufacturing method of the transistor with floating gate electrode according to claim 9, wherein the steps of forming the second insulating film and the third insulating film on the polysilicon film and forming the floating gate electrode between the second insulating film and the third insulating film comprise:
sequentially depositing the second insulating film and a second non-crystalline silicon film on the polysilicon film by a vapor deposition process;
coating a second layer of photoresist on a surface of the second non-crystalline silicon film, exposing and developing the second layer of photoresist so that a reserved portion of the second layer of photoresist correspond to the channel region;
reserving a portion of the second non-crystalline silicon film corresponding to the channel region by an etching process to form the floating gate electrode;
stripping the second layer of photoresist; and
depositing the third insulating film on a surface of the second insulating film and a surface of the floating gate electrode by a vapor deposition process.

16. The manufacturing method of the transistor with floating gate electrode according to claim 9, wherein the step of forming the control gate electrode on the third insulating film comprises:
heavily doping borane ions or phosphorane ions into the source region and the drain region to form conducting layers;
stripping the third layer of photoresist;
depositing a metal film on non-etched regions of the second insulating film and the third insulating film and on the source region and the drain region of the polysilicon film by a vapor deposition process;
depositing a fourth layer of photoresist on the metal film and exposing and developing the fourth layer of photoresist;
etching the metal film to form the control gate electrode; and
stripping the fourth layer of photoresist.

* * * * *